United States Patent [19]

Wada et al.

[11] Patent Number: 4,893,282

[45] Date of Patent: Jan. 9, 1990

[54] SEMICONDUCTOR MEMORY DEVICE

[75] Inventors: Tomohisa Wada; Hirofumi Shinohara, both of Hyogo, Japan

[73] Assignee: Mitsubishi Denki Kabushiki Kaisha, Tokyo, Japan

[21] Appl. No.: 133,153

[22] Filed: Dec. 7, 1987

Related U.S. Application Data

[63] Continuation of Ser. No. 809,173, Dec. 16, 1985, abandoned.

[30] Foreign Application Priority Data

Feb. 26, 1985 [JP] Japan .................................. 60-39601

[51] Int. Cl.$^4$ ......................... G11C 8/00; G11C 11/40
[52] U.S. Cl. ............................. 365/233.5; 365/189.08; 365/230.06
[58] Field of Search ............... 365/203, 204, 230, 233, 365/189, 189.08, 230.06, 233.5; 307/449, 463, 481

[56] References Cited

U.S. PATENT DOCUMENTS

| | | | |
|---|---|---|---|
| 4,404,474 | 9/1983 | Dingwall | 307/449 |
| 4,405,996 | 9/1983 | Stewart | 365/203 |
| 4,408,305 | 10/1983 | Kuo | 365/189 |
| 4,471,240 | 9/1984 | Novosel | 307/463 |
| 4,614,883 | 9/1986 | Sood et al. | 365/230 |
| 4,744,063 | 5/1988 | Ohtani et al. | 365/203 |

FOREIGN PATENT DOCUMENTS 0117342 10/1978 Japan .
2092850 8/1982 United Kingdom .

OTHER PUBLICATIONS

Hardee and Sud, "A Fault–Tolerant 30 ns/375 mW 16K×1 NMOS Static Ram", *IEEE Journal of Solid–State Circuits*, vol. SC-16, No. 5, (Oct. 1981), pp. 435–443.

Intel Corporation: Component Data Catalog, Jan. 1981, pp. 5-1 to 5-14.

"16-K Static RAM Takes New Route to High Speed", by Rahul Sud & Kim C. Hardee, Electronics, Sep. 11, 1980, pp. 117–123.

*Primary Examiner*—Glenn A. Gossage
*Attorney, Agent, or Firm*—Lowe, Price, Leblanc, Becker & Shur

[57] ABSTRACT

In a semiconductor memory device in accordance with the present invention, a plurality of address signals ($A_1$ to $A_N$) are applied to address transition detection (ATD) circuits (31 to 3N) through input buffers (11 to 1N) and according to a level change in the address signals, a pulse signal (ATDi) is applied to an inverter (5) through any of MOS field-effect transistors (41 to 4N). The input level of the inverter (5) falls rapidly in response to the rise of the output level of the ATD circuits (31 to 3N) and rises slowly by the influence of a load device (40). A chip select transition detection (CSTD) circuit (6) generates a pulse signal ($\overline{CST}$) in response to the change from a high level to a low level of a chip selection signal (CS) provided from a CS buffer (2). In response to the pulse signal ($\overline{CST}$), a p channel MOS field-effect transistor (71) is turned on and a load device (72) is connected between the power supply potential and the input of the inverter (5). As a result, the impedance therebetween is lowered and an ATD signal rises rapidly. Thus, a delay with respect to the access by the address signals can be prevented.

7 Claims, 3 Drawing Sheets

SEMICONDUCTOR MEMORY DEVICE

This application is a continuation of Application Ser. No. 809,173, filed December 16, 1985, now abandoned.

BACKGROUND OF THE INVENTION

1. Field of the Invention

The present invention relates to a semiconductor memory device. More particularly, the present invention relates to an improvement of a semiconductor memory device such as an internal synchronization static RAM.

2. Description of the Prior Art

An internal synchronization static RAM is known for example by the paper "16K static RAM takes new route to high speed" by Rahul Sud and Kim C. Hardee in Electronics/September 11, 1980 pp. 117–123.

FIG. 1 is a block diagram showing a construction of a conventional internal synchronization static RAM. First, referring to FIG. 1, a conventional internal synchronization static RAM will be described. Address signals $A_1$ to $A_N$ are applied to input buffers 11 to 1N. A chip selection input signal $\overline{CS}$ext is applied to a CS buffer 2, from which a chip selection signal $\overline{CS}$ is commonly applied to the above stated input buffers 11 to 1N.

The input buffers 11 to 1N constitute a NOR circuit for receiving the address signals and the chip selection signal $\overline{CS}$. The outputs of the input buffers 11 to 1N are applied to address transition detector circuits (referred to hereinafter as ATD circuits) 31 to 3N, respectively. The ATD circuits 31 to 3N generate a one-shot pulse signal according to a level change in the address signals $A_1$ to $A_N$. The one-shot pulse signal provided from the ATD circuits 31 to 3N is supplied to a NOR circuit 4.

The NOR circuit 4 comprises MOS field-effect transistors 41 to 4N and a load device 40. More specifically, the respective gate inputs of the MOS field effect transistors 41 to 4N are connected to the outputs of the ATD circuits 31 to 3N, the respective sources thereof are connected to the grounding potential and the respective drains thereof are connected commonly to the input of the inverter 5. Between the input of the inverter 5 and the power supply potential $V_{cc}$, the load device 40 is connected. The load device 40 comprises for example a circuit including in series a MOS field-effect transistor and a resistor. The inverter 5 is formed by an enhancement-enhancement arrangement or enhancement-depletion arrangement of n channel MOS field effect transistors or by CMOS transistors.

FIGS. 2(a)–2(j) represent an operation timing chart of the conventional semiconductor memory device shown in FIG. 1. Referring to FIGS. 1 and 2(a)–2(j), the operation of the conventional semiconductor memory device will be described in the following. First, as shown in FIG. 2(b), the chip is enabled when the chip selection inputsignal $\overline{CX}$ext is at a low level. Then, as shown in FIG. 2(a), when the level of any of the address signals $A_1$ to $A_N$ is changed, there is ia change in the output corresponding to the address signal having the changed level, from the input buffers 11 to 1N. Subsequently, out of the ATD circuits 31 to 3N, the one corresponding to the input buffer having the output changed generates a one-shot pulse signal ATDi as shown in FIG. 2(c). When the one-shot pulse signal ATDi is supplied from any one of the ATD circuits 31 to 3N to the NOR circuit 4, an ATD signal as shown in FIG. 2(d) is supplied to the inverter 5. The inverter 5 inverts the polarity of the ATD signal and provides an ATD signal as shown in FIG. 2(e). The ATD signal falls rapidly but rises slowly as shown in FIG. 2(d), because the rise is made by storage in the load device 40 connected between the power supply potential $V_{cc}$ and the input of the inverter 5. The ATD signal thus generated serves as a basic clock signal for controlling the operation time of a peripheral circuit such as a sense amplifier or a bit line load, not shown.

Then, when the chip selection input signal $\overline{CS}$ext is changed from the high level to the low level as shown in FIG. 2(f), all the outputs of the input buffers 11 to 1N are changed from the high level to the low level. At the time of the change from the high level to the low level of the chip selection input signal $\overline{CS}$ext, the chip selection input signal $\overline{CS}$ext is delayed by the CS buffer 2, so that a chip selection signal CS as shown in FIG. 2(g) is supplied with a change from the high level to the low level. Then, with a delay corresponding to the delay of the signal $\overline{CS}$ext, the outputs of the ATD circuits 31 to 3N are changed so that the ATD signal shown in FIG. 2(j) is delayed by a period corresponding to the delay by the CS buffer 2.

Thus, in the conventional semiconductor memory device constructed as shown in FIG. 1, as a result of the delay of the chip selection input signal $\overline{CS}$ext by the CS buffer 2, the ATD signal is delayed by the time t shown in FIG. 2. In other words, the conventional semiconductor memory device has a disadvantage that the access by the chip selection input signal $\overline{CS}$ext is delayed compared with the access by the address signal $A_1$ to $A_N$.

SUMMARY OF THE INVENTION

Therefore, a principal object of the present invention is to provide a semiconductor memory device in which the reading speed at the tiem of change in a chip selection input signal can be increased without making considerable change in the construction of a conventional device.

Briefly stated, in a semiconductor memory device of the present invention, first pulse signal generating circuits provided corresponding to a plurality of address signals generate a first pulse signal according to a level change in the address signals and the first pulse signal is provided as output through an OR circuit. Then, a second pulse signal generating circuit generates a second pulse signal according to a level change of a chip selection signal and an operation speed controlling circuit makes control in response to the second pulse signal so as to increase the operation speed of the OR circuit.

Consequently, according to the present invention, by making fast the rising speed of the trailing edge of the first pulse signal provided from the OR circuit according to the level change of the chip selection signal, the access at the time of the level change of the chip selection signal can be prevented from being delayed compared with the access at the time of the change of the address signals.

In a preferred embodiment of the present invention, an OR circuit comprises a plurality of MOS field-effect transistors having respectively gates connected to the output of the first pulse signal generating circuits, sources connected to the grounding potential and drains connected commonly. A first load device is connected between the power supply potential and the drains of the plurality of MOS field-effect transistors and a second load device is connected between the power supply potential and the drains of the plurality of MOS field-effect transistors so that the second load device is enabled by the second pulse signal. The second load device comprises a series circuit including in series a MOS field-effect transistor and a resistor.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
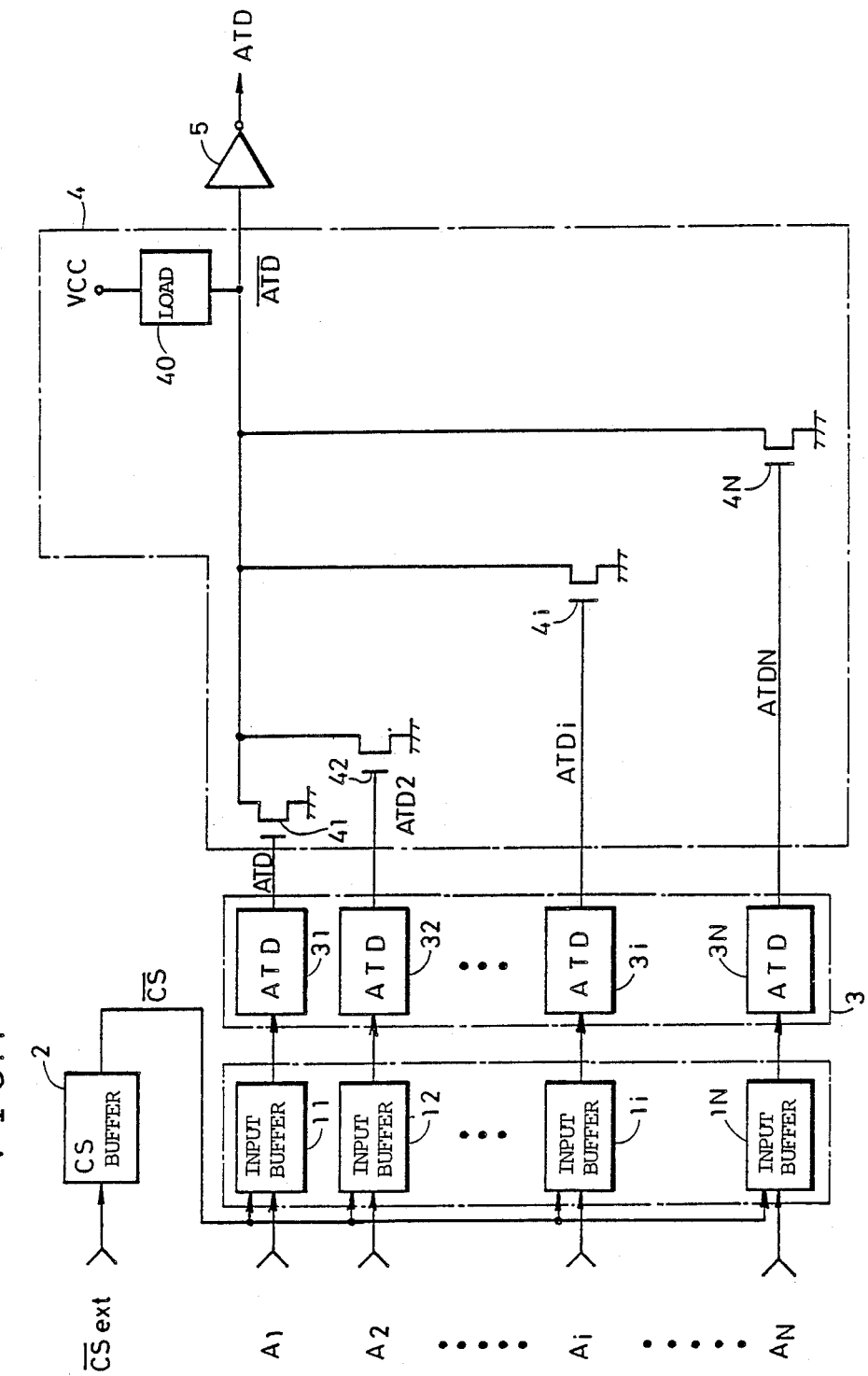
FIG. 1 is a block diagram of a conventional semiconductor memory device.
Figure 3:
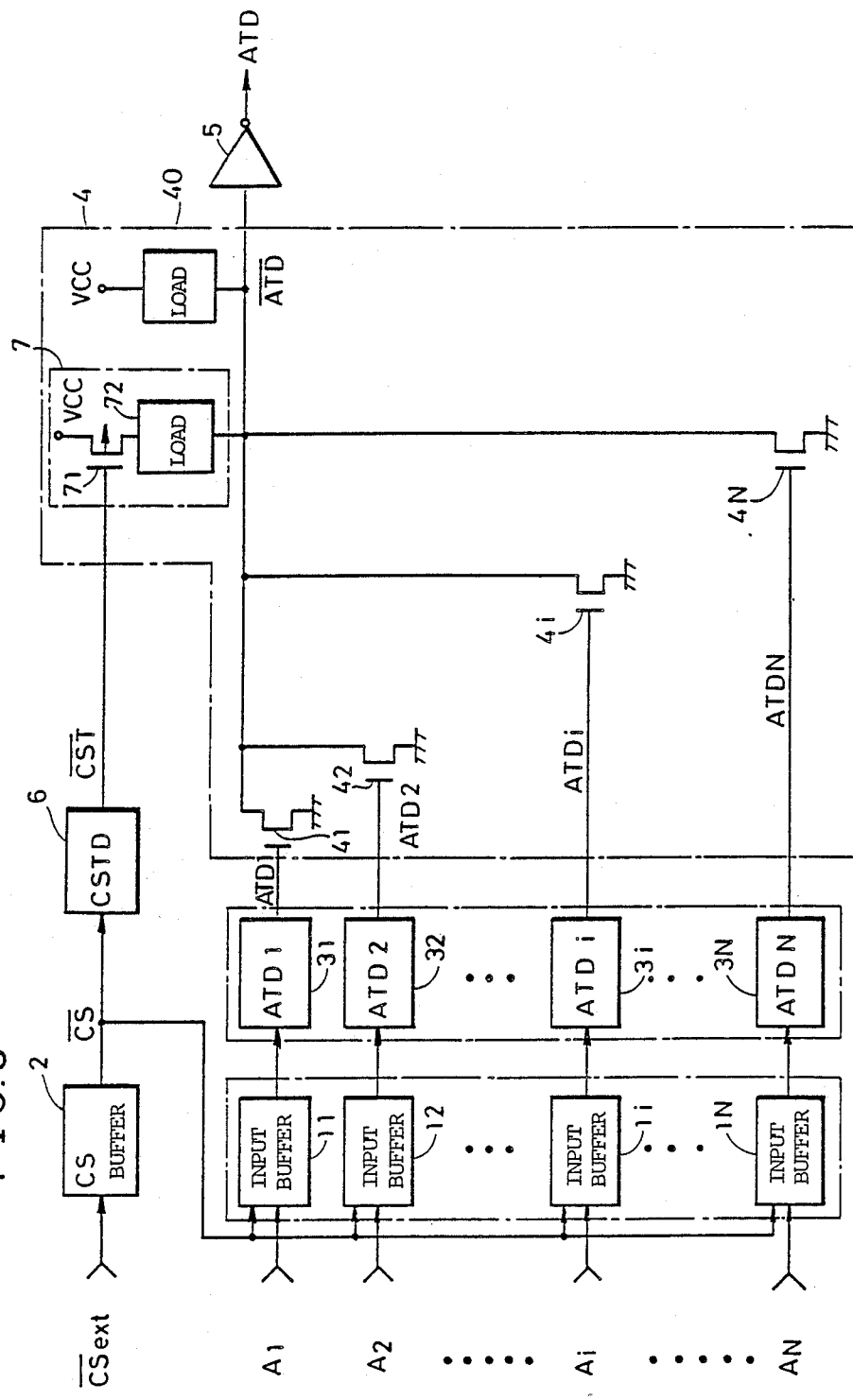
FIG. 3 is a schematic block diagram of an embodiment of the present invention.

FIG. 3 is a schematic block diagram of an embodiment of the present invention. In a semiconductor memory device shown in FIG. 3, a CSTD circuit for providing a one-shot CS pulse signal at the time of change from the high level to the low level of the chip selection signal $\overline{CS}$ is connected to the output of a CS buffer 2 as shown in FIG. 1 so that a $\overline{CST}$ signal provided from the CSTD circuit is supplied to a load device 7. The load device 7 comprises a series circuit including in series a p channel MOS field-effect transistor 71 and a load 72 formed by a resistor, the p channel MOS field-effect transistor 71 being connected between the power supply potential $V_{cc}$ and the commonly connected drains of the MOS field-effect transistors 41 to 4N in the NOR circuit 4.

Figure 2:
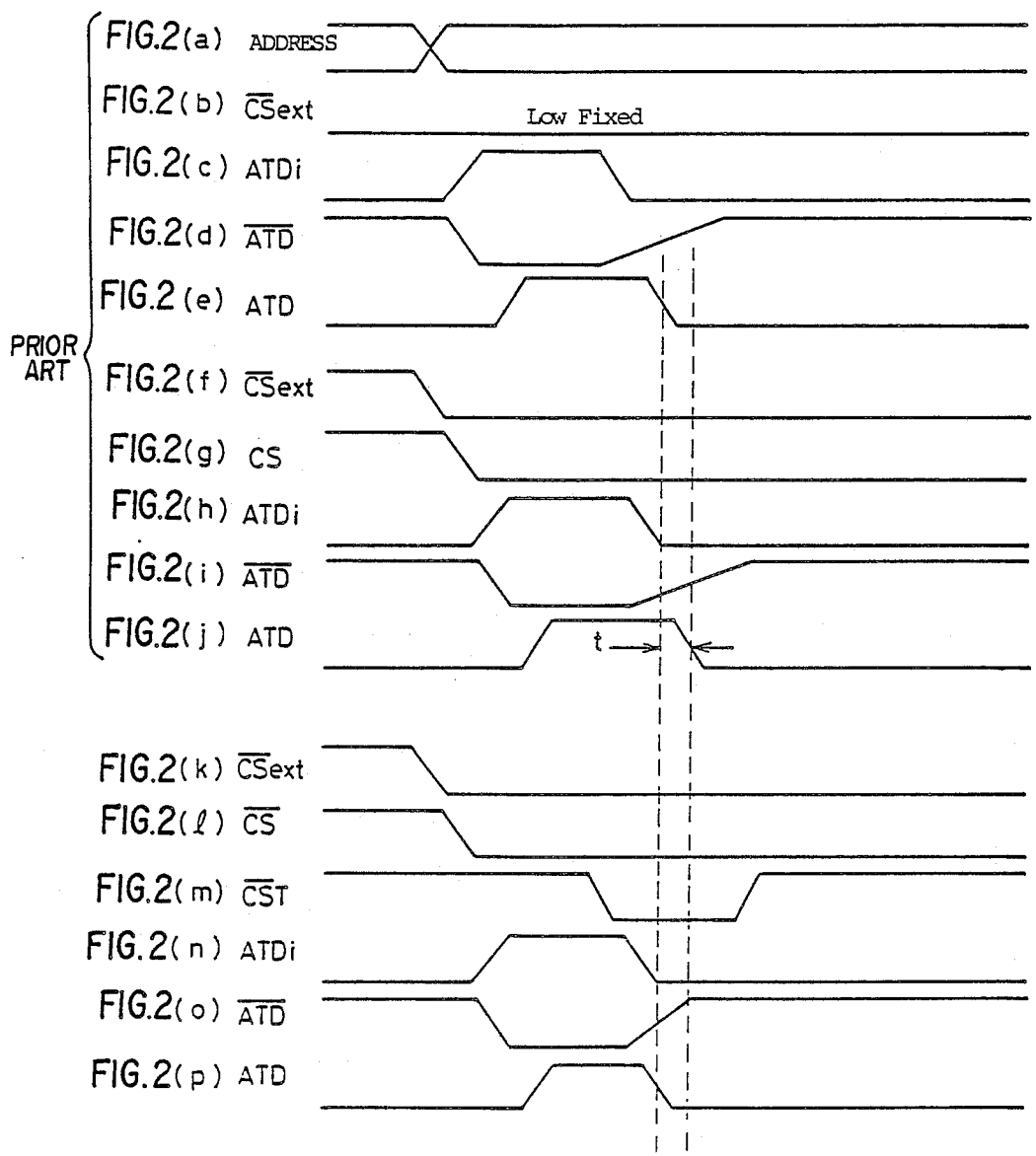
FIGS. 2a–2b represent a timing chart for explaining the operation of the conventional semiconductor memory device shown in FIG. 1 and the operation of an embodiment of the present invention.

FIGS. 2(k) to 2(p) show timing charts of the embodiment shown in FIG. 3. When the chip selection input signal CSext changes from the high level to the low level as shown in FIG. 2(k), the chip selection signal $\overline{CS}$ is delayed by the CS buffer 2 by a given period of time as shown in FIG. 2 (l) and then signal $\overline{CS}$ changes from the high level to the low level. On the other hand, the outputs of the input buffers 11 to 1N which are fixed at the low level are changed according to a level change in the address signals $A_1$ to $A_N$ as the result of the change of the chip selection signal $\overline{CS}$ to the low level. In consequence, the ATD circuits 31 to 3N provide the one-shot pulse signal ATDi shown in FIG. 2(n) in the same manner as described previously in connection with FIG. 2. The one-shot pulse signal ATDi is delayed by a period delayed by the CS buffer 2.

The one-shot pulse signal ATDi provided from any one of the ATD circuits 31 to 3N is supplied as the $\overline{ATD}$ signal shown in FIG. 2(c) to the inverter 5 through any one of the MOS field-effect transistors 41 to 4N. The input of the inverter 5, that is, the $\overline{ATD}$ signal falls rapidly in response to the rise of the output pulse of the ATD circuits 31 to 3N and rises slowly in response to the fall of the pulse. The slow rise is due to the fact that the rise is made only by the load device 40 connected between the power supply potential $V_{cc}$ and the input of the inverter 5.

On the other hand, according to the change of the output of the CS buffer 2, that is, the chip selection signal $\overline{CS}$ from the high level to the low level, the CSTD circuit 6 provides a one-shot pulse signal $\overline{CST}$ as shown in FIG. 2(m). In response to the pulse signal $\overline{CST}$, the p channel MOS field-effect transistor 71 is turned on and the impedance between the power supply potential $V_{cc}$ and the input of the inverter 5 is lowered. As a result, the time constant which is the product of the above stated impedance and the capacity of the MOS field-effect transistors 41 to 4N is decreased and the ATD signal rises sharply as shown in FIG. 2(p). Accordingly, since the ATD signal rises rapidly, a delay in the access time at the change of the chip selection input signal $\overline{CS}$ext can be corrected by a period corresponding to a delay by the CS buffer 2 compared with the access by the address signal $A_1$ to $A_N$. Thus, the same access as by the address signals $A_1$ to $A_N$ can be attained by the chip selection signal.

Although in the above described embodiment, the load device 7 is formed by connecting in series the p channel MOS field-effect transistor 71 and the resistor 72, the load device 7 may be formed only by the p channel MOS field-effect transistor 71. More specifically, any load device may be used in so far as it can be controlled by the pulse signal $\overline{CST}$ provided from the CSTD circuit 6.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor static memory device having a plurality of memory cells comprising:

means for receiving an externally generated, chip selection signal;

first pulse signal generating circuits corresponding to a plurality of address signals designating the addresses of said memory cells for generating selectively a first pulse signal in response to a level change in a corresponding address signal, said chip selection signal being independent of said address signals;

logic circuit means responsive to any of said first pulse signals generated by said first pulse signal generating circuits for generating an output signal to access an addressed one of said memory cells, a second pulse signal generating circuit for generating a second pulse signal in response to a level change in the chip selection signal, and a speed control circuit operative in response to said second pulse signal generated by said second pulse signal generating circuit to reduce a response time of said logic circuit means to access the addressed memory cell, wherein said logic circuit means comprises a plurality of MOS field-effect transistors respectively provided with gates connected to the outputs of said plurality of first pulse signal generating circuits, sources thereat connected to a ground potential and drains thereat connected together, a first load device connected between a power supply potential and said commonly connected drains of said plurality of MOS field-effect transistors, and a second load device connected between said power supply potential and said commonly connected drains of said plurality of MOS field-effect transistors, said second load device being controlled by said second pulse signal from said second pulse signal generating circuit.

2. A semiconductor memory device in accordance with claim 1, wherein
said second load device comprises a MOS field-effect transistor.

3. A semiconductor memory device in accordance with claim 1, wherein
said second load device comprises a circuit including in series a MOS field-effect transistor and a resistor.

4. A semiconductor memory device in accordance with claim 1, wherein said logic circuit means comprises an OR circuit.

5. A method of operating a semiconductor static memory device having a plurality of memory cells and logic circuit means responsive to an address signal for addressing a particular one of said memory cells, including a plurality of MOS field-effect transistors respectively provided with gates connected to the outputs of a plurality of first pulse signal generating circuits, sources thereat connected to a ground potential and drains thereat connected together, a first load device connected between a power supply potential and said commonly connected drains of said plurality of MOS field-effect transistors, and a second load device connected between said power supply potential and said commonly connected drains of said plurality of MOS field-effect transistors, said second load device being controlled by a second pulse signal from a second pulse signal generating circuit, said method comprising the steps of:
receiving an externally generated, chip selection signal;
generating said second pulse signal in response to a level change in the chip selection signal;
receiving a plurality of address signals designating the addresses of the memory cells;
generating a control signal in response to a level change in any of said address signals;
generating an output signal to access an addressed one of the memory cells in response to said control signal; and
in response to the second pulse signal, reducing an access time to the addressed one of the memory cells by controlling the second load device with said second pulse signal thereby reducing a transition time of said output signal.

6. A semiconductor static memory device having a plurality of memory cells, comprising:
first input means for receiving an externally generated chip selection signal;
second input means for receiving externally generated memory address signals independent of said chip selection signal;
first pulse signal generating circuits corresponding to a plurality of address signals received at said second input means and designating the addresses of said memory cells for generating selectively a first pulse signal in response to a level change in a corresponding address signal;
logic circuit means responsive to any of said first pulse signals generated by said first pulse signal generating circuits for generating an output signal to access an addressed one of said memory cells;
a second pulse signal generating circuit for generating a second pulse signal in response, and delayed with respect, to a level change in the chip selection signal, said second pulse signal being active only in a region of a transition of said first pulse signals; and
a speed control circuit operative in response to said second pulse signal to temporarily reduce a response time of said logic circuit means to access the addressed memory cell, wherein said logic circuit means comprises
(a) a plurality of MOS field-effect transistors respectively provided with gates connected to the outputs of said plurality of first pulse signal generating circuits, sources thereat connected to a ground potential and drains thereat connected together,
(b) a first load device connected between a power supply potential and said commonly connected drains of said plurality of MOS field-effect transistors, and
(c) a second load device connected between said power supply potential and said commonly connected drains of said plurality of MOS field-effect transistors, said second load device being controlled by said second pulse signal from said second pulse signal generating circuit.

7. A method of operating a semiconductor static memory device having a plurality of memory cells, wherein said device receives, as input signals, a chip selection signal and a plurality of address signals, said device including a logic circuit responsive to said address signals for addressing a particular one of said memory cells, said logic circuit including (a) a plurality of MOS field-effect transistors respectively provided with gates connected to the outputs of said plurality of first pulse signal generating circuits, sources thereat connected to a ground potential and drains thereat connected together, (b) a first load device connected between a power supply potential and said commonly connected drains of said plurality of MOS field-effect transistors, and (c) a second load device connected between said power supply potential and said commonly connected drains of said plurality of MOS field-effect transistors, said second load device being controlled by a second pulse signal from a second pulse signal generating circuit;
said method comprising the steps of:
generating a first pulse signal in response to a level change in a corresponding address signal from among said plurality of address signals;
in response to said first pulse signal, generating an output signal from said logic circuit to access an addressed one of said memory cells;
in responsive to a level change in the chip selection signal, generating a second pulse delayed with respect to said chip selection signal and being active only in a region of a transition of said first pulse signal; and
reducing a response time of said logic circuit means during the duration of said second pulse signal, by controlling the second load device with said second pulse signal thereby reducing a transition time of said output signal, to address the addressed memory cell.

* * * * *